US011081570B2

(12) United States Patent
Jambunathan et al.

(10) Patent No.: US 11,081,570 B2
(45) Date of Patent: Aug. 3, 2021

(54) TRANSISTORS WITH LATTICE MATCHED GATE STRUCTURE

(71) Applicant: INTEL CORPORATION, Santa Clara, CA (US)

(72) Inventors: Karthik Jambunathan, Kirkland, WA (US); Glenn A. Glass, Portland, OR (US); Anand S. Murthy, Portland, OR (US); Jack T. Kavalieros, Portland, OR (US); Seung Hoon Sung, Portland, OR (US); Benjamin Chu-Kung, Boise, ID (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,845

(22) PCT Filed: Sep. 28, 2016

(86) PCT No.: PCT/US2016/054193
§ 371 (c)(1),
(2) Date: Feb. 20, 2019

(87) PCT Pub. No.: WO2018/063192
PCT Pub. Date: Apr. 5, 2018

(65) Prior Publication Data
US 2019/0189785 A1 Jun. 20, 2019

(51) Int. Cl.
*H01L 29/66* (2006.01)
*H01L 29/78* (2006.01)
*H01L 29/10* (2006.01)

(52) U.S. Cl.
CPC .... *H01L 29/66803* (2013.01); *H01L 29/1025* (2013.01); *H01L 29/66* (2013.01);
(Continued)

(58) Field of Classification Search
CPC ........... H01L 29/66803; H01L 29/1025; H01L 29/66; H01L 29/66545; H01L 29/66795; H01L 29/7851
See application file for complete search history.

(56) References Cited

U.S. PATENT DOCUMENTS 6,528,377 B1 3/2003 Mihopoulos et al.
7,476,600 B1 1/2009 Atanackovic
(Continued)

FOREIGN PATENT DOCUMENTS

WO 2018063192 A1 4/2018

OTHER PUBLICATIONS

International Search Report and Written Opinion received for PCT/US2016/054193, dated Jun. 7, 2017. 14 pages.
(Continued)

*Primary Examiner* — Seahvosh Nikmanesh
(74) *Attorney, Agent, or Firm* — Schwabe, Williamson & Wyatt, P.C.

(57) ABSTRACT

Integrated circuit transistor structures are disclosed that include a gate structure that is lattice matched to the underlying channel. In particular, the gate dielectric is lattice matched to the underlying semiconductor channel material, and in some embodiments, so is the gate electrode. In an example embodiment, single crystal semiconductor channel material and single crystal gate dielectric material that are sufficiently lattice matched to each other are epitaxially deposited. In some cases, the gate electrode material may also be a single crystal material that is lattice matched to the semiconductor channel material, thereby allowing the gate electrode to impart strain on the channel via the also lattice matched gate dielectric. A gate dielectric material that is lattice matched to the channel material can be used to reduce interface trap density ($D_{it}$). The techniques can be used in
(Continued)

both planar and non-planar (e.g., finFET and nanowire) metal oxide semiconductor (MOS) transistor architectures.

20 Claims, 8 Drawing Sheets

(52) U.S. Cl.
CPC .. *H01L 29/66545* (2013.01); *H01L 29/66795* (2013.01); *H01L 29/7851* (2013.01)

(56) References Cited

U.S. PATENT DOCUMENTS

| | | |
|---|---|---|
| 2003/0183885 A1 | 10/2003 | Nishikawa et al. |
| 2006/0208313 A1 | 9/2006 | Atanackovic |
| 2008/0111195 A1 | 5/2008 | Atanackovic |
| 2008/0142841 A1* | 6/2008 | Lindert ............... H01L 29/1054 257/190 |
| 2013/0264639 A1 | 10/2013 | Glass et al. |
| 2014/0027860 A1 | 1/2014 | Glass et al. |
| 2016/0260802 A1 | 9/2016 | Glass et al. |

OTHER PUBLICATIONS

International Preliminary Report on Patentability received for PCT/US2016/054193, dated Apr. 2, 2019. 10 pages.

Schroder, Dieter K., "Electrical Characterization of Defects in Gate Dielectrics," Defects in Microelectronic Materials and Devices, 2008. 37 pages.

Office Action from Taiwan Patent Application No. 106127965, dated Feb. 3, 2021, 18 pages.

* cited by examiner

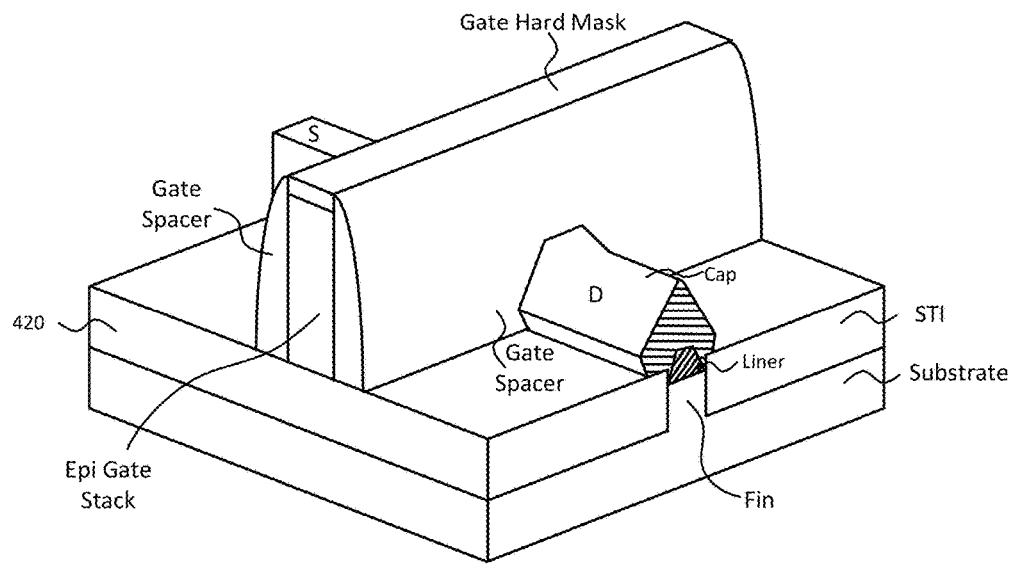
Fig. 4a
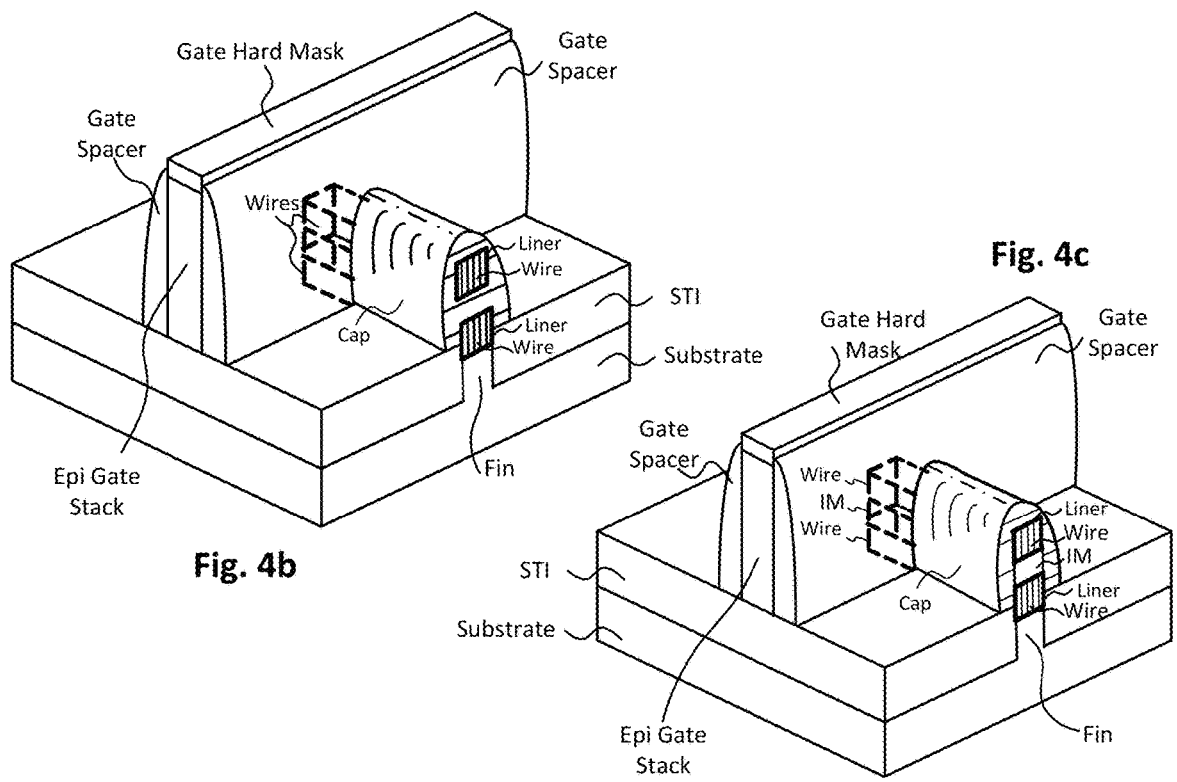
Fig. 4b
Fig. 4c

US 11,081,570 B2

TRANSISTORS WITH LATTICE MATCHED GATE STRUCTURE

CROSS-REFERENCE TO RELATED APPLICATION

This patent application is a U.S. National Phase Application under 35 U.S.C. § 371 of International Application No. PCT/US2016/054193, filed Sep. 28, 2016, entitled "TRANSISTORS WITH LATTICE MATCHED GATE STRUCTURE," which designates the United States of America, the entire disclosure of which is hereby incorporated by reference in its entirety and for all purposes.

BACKGROUND

Semiconductor devices are electronic components that exploit the electronic properties of semiconductor materials, such as silicon (Si), germanium (Ge), and gallium arsenide (GaAs), to name a few common examples of semiconductor materials. A field-effect transistor (FET) is a semiconductor device that generally includes a gate, a source, and a drain. Metal-oxide-semiconductor FETs or so-called MOSFETs are commonly used for amplifying or switching electronic signals. In operations, a FET uses an electric field applied to the gate to control the electrical conductivity of a channel through which charge carriers (e.g., electrons or holes) flow from the source to the drain. A gate dielectric is used to separate the gate from other regions of the FET, including the source and drain as well as the channel that connects source and drain when the transistor is biased to an on or otherwise conductive state (as opposed to an off-state or non-conductive state). The source and drain regions can be either p-type or n-type doped to provide PMOS FETs or NMOS FETs, respectively. In some cases, MOSFETs include side-wall or so-called gate spacers on either side of the gate that can help determine the channel length and can help with replacement gate processes. Complementary MOS (CMOS) integrated circuit structures use a combination of PMOS and NMOS FETs to implement logic gates and other digital circuits. FETs can be implemented in both planar and non-planar architectures. For instance, a finFET is a non-planar transistor built around a thin strip of semiconductor material (generally referred to as a fin). A finFET includes the standard FET nodes, including a gate, a gate dielectric, a source, and a drain. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Another type of finFET is the so-called double-gate finFET configuration, in which the conductive channel principally resides only along the two sidewalls of the fin (and not along the top of the fin). Another non-planar transistor configuration is sometimes referred to as a nanowire configuration, which is configured similarly to a fin-based transistor, but instead of a finned channel region, one or more nanowires (or nanoribbons, depending on aspect ratio) are used and the gate material generally surrounds each nanowire. Such nanowire configurations are sometimes called gate-all-around FETs. For any such configurations, there are a number of performance issues that can arise.

BRIEF DESCRIPTION OF THE DRAWINGS

FIGS. 4a through 4c each illustrates a perspective view of an integrated circuit structure formed during the method of FIG. 1, and that is configured in accordance with other embodiments of the present disclosure.

Figure 1:
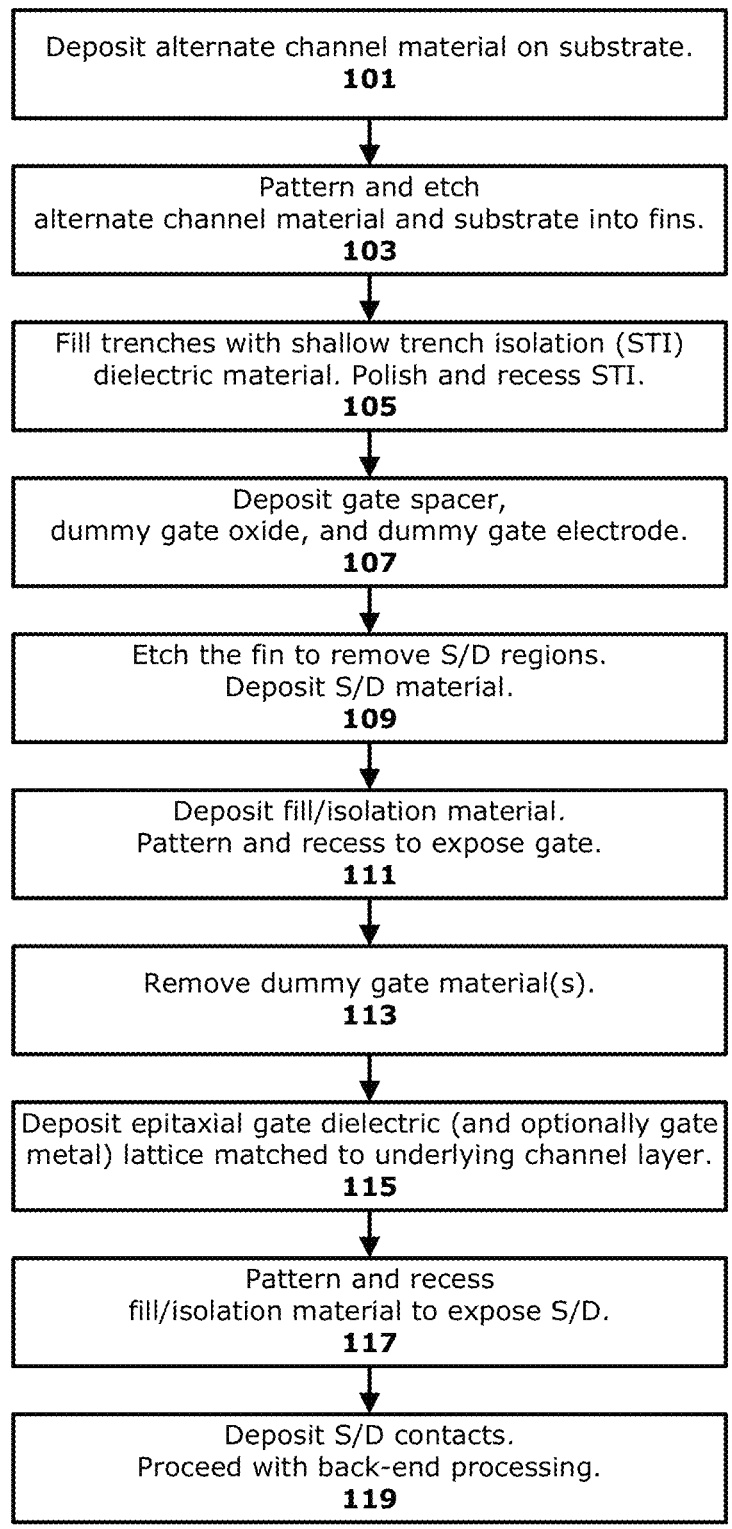
FIG. 1 illustrates a method for forming an integrated circuit including one or more MOS transistors configured with a gate stack lattice matched to channel material, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations and structures shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Moreover, the resulting structures depicted don't necessarily show each and every feature of a functional integrated circuit; rather, the structures are drawn to depict certain features to help facilitate understanding of the disclosure. Various other not shown features of each integrated circuit structure, whether those features end up in the final structure or are sacrificial or otherwise intermediate in nature, will be apparent in light of this disclosure. In short, the figures are provided to facilitate understanding of the techniques provided the present disclosure, and numerous structures may result from carrying out such techniques.

DETAILED DESCRIPTION

Integrated circuit transistor structures are disclosed that include a gate structure that is lattice matched to the underlying channel. In particular, the gate dielectric is lattice matched to the underlying channel material, and in some embodiments, so is the gate electrode. A gate dielectric material that is lattice matched to the channel material can be used to reduce $D_{it}$, and a gate electrode material that is lattice matched to the channel material can be used to impart strain on the channel. Such lattice matched gate stack configurations may also reduce charge leakage and improve drive current. In an example embodiment, single crystal channel and gate dielectric materials that are sufficiently lattice matched to each other are epitaxially deposited. In some cases, the gate electrode may also be a single crystal material that is lattice matched to the channel material, thereby allowing the gate electrode to impart strain on the channel via the gate dielectric. The techniques can be used in both planar and non-planar (e.g., finFET and nanowire) transistor architectures. Numerous embodiments will be apparent.

General Overview

As previously noted, there are a number of performance issues that can arise with MOS transistors. One such problem is generally referred to as interface trap charge density. An interface trap charge or simply "trap" manifests at the interface between the semiconductor channel material and the overlying gate dielectric material, within the gate dielectric material. The traps arise because, as the transistor device operates, charge carriers (electrons or holes) from the channel tunnel into the gate dielectric material and get trapped therein near the channel/dielectric interface. A transistor having a high interface trap density ($D_{it}$) tends to have lower performance, and specifically lower electron/hole mobility. This is because the trapped charges effectively operate to rob carriers from the channel thereby reducing conduction current of the channel. High $D_{it}$ is further associated with increased leakage and capacitance (and thus slower transistor switching speed). One solution to poor electron/hole mobility involves the use of epitaxial source/drain induced strain on the channel. However, poor mechanical coupling between the source/drain and channel materials precludes such strain. This coupling issue is particularly problematic when using alternative channel materials (channel material is compositionally different from the substrate) and non-planar architectures (e.g., finFETs).

Thus, the present disclosure provides a gate structure that is lattice matched to the underlying channel material. In particular, the gate dielectric is lattice matched to the underlying channel material. In some embodiments, the gate electrode is also lattice matched to the underlying channel material. A gate dielectric material that is lattice matched to the channel material can be used to reduce $D_{it}$. In addition, a gate electrode material that is lattice matched to the channel material can be used to impart strain on the channel. Such a lattice matched gate stack may also therefore reduce charge leakage and improve drive current in NMOS and PMOS transistor devices. In an example embodiment, single crystal channel and gate dielectric materials that are sufficiently lattice matched to each other are used. In some cases, the gate electrode may also be a single crystal material that is lattice matched to the channel material, thereby allowing the gate electrode to impart strain on the channel via the gate dielectric.

The various single crystal materials used in the channel and gate structure (gate dielectric only, or both gate dielectric and gate electrode) can be selected based on their ability to lattice match with the desired channel material. An epitaxial deposition process is used to provide the single crystal materials. In accordance with an embodiment, if single crystal material 1 and single crystal material 2 are said to be lattice matched to one another, this means that the lattice parameters of material 1 and material 2 are equal within +/−2%. In a more general sense, material 1 and material 2 are said to be lattice matched to one another if the lattice parameters of those materials 1 and 2 are the same or otherwise within an acceptable tolerance so as to allow for lattice continuity across the interface between the different single crystal materials 1 and 2.

As used herein, the term "lattice parameter" refers to the distance between rows of atoms or spacing between rows of atoms in a given crystallographic direction of a single crystal material. The single crystal material may be elemental or a compound or alloy. The distance or spacing between rows of atoms can vary as a function of the alloy concentrations or phase of a given single crystal compound. So, the types and quantity of each of the atoms used in a given single crystal material will dictate the lattice parameter and crystal structure. As will be appreciated in light of this disclosure, there are various combinations of single crystal semiconductor materials and single crystal dielectric materials where the lattice parameters of those different materials are sufficiently matched (e.g., within 2%) and the crystal type is cubic, such that those materials will grow on each other and make a lattice matched interface with favorable electronic properties. As will be further appreciated, such combinations may further include single crystal gate electrode materials having lattice parameters that are similarly matched. For elemental single crystal materials, the lattice parameter can be measured, for example, to be the average distance between adjacent planes of atoms (as measured from center of nuclei) of the single crystal material in a given crystallographic direction. For compound and alloy single crystal materials, the lattice parameter can similarly be measured as the average distance between adjacent planes of atoms of the compound or alloy single crystal material.

In accordance with some embodiments, the channel material includes a single crystal semiconductor material from group IV or III-V of the periodic table of elements. Example single crystal channel semiconductor materials include, for instance, silicon, germanium, tin, indium, gallium, arsenic, and aluminum, to name a few. In addition, the gate dielectric material includes single crystal dielectric materials having suitable dielectric properties and the ability to lattice match with the given channel material. In some cases, the single crystal gate dielectric material is a high-k gate dielectric. Example single crystal gate dielectric materials include, for instance, an oxide material including strontium, titanium, lanthanum, aluminum, neodymium, lutetium, or gadolinium, to name a few. The gate electrode, when also lattice matched to the channel material according to some embodiments, may be a single crystal metal or doped semiconductor. Example single crystal gate electrode materials include, for instance, a single crystal elemental or alloyed metal, or a doped group IV or III-V single crystal semiconductor doped with phosphorous, arsenic, antimony, boron, aluminum, or silicon. In other embodiments, note that the gate electrode need not be lattice matched and may be implemented with, for instance, polycrystalline or amorphous material (e.g., polycrystalline silicon or amorphous tantalum tungsten). Numerous materials systems will be appreciated in light of this disclosure.

As will be further appreciated in light of this disclosure, using an epitaxial (single crystal) gate dielectric in the transistor design can have the effect of reducing the interface trap density ($D_{it}$), because there are little or no crystalline defects to cause traps. In contrast, transistor designs that employ dissimilar and lattice mismatched or amorphous gate dielectric materials are prone to relatively high $D_{it}$. To this end, typical gate dielectric materials are amorphous or polycrystalline rather than single crystal (not epitaxial). As will be further appreciated in light of this disclosure, an epitaxial (single crystal) gate electrode that is lattice-matched to the channel material can be used to improve channel mobility, by mechanically coupling the gate electrode to the channel by way of the lattice matched combination of the gate dielectric and gate electrode materials. Thus, in some embodiments there is lattice continuity through the channel-dielectric interface and not the dielectric-electrode interface, while in other embodiments there is lattice continuity through both the channel-dielectric interface and the dielectric-electrode interface. In contrast, transistor designs that employ amorphous or polycrystalline gate electrode materials are not lattice matched to the channel material. Numerous other benefits and advantages will be apparent in light of this disclosure.

For example, CMOS transistor structures implemented with alternate channel materials (e.g., substrate is silicon and channel material is not silicon) are particularly susceptible to high $D_{it}$. This is because alternate channel materials are typically not compatible with traditional gate dielectric materials such as silicon dioxide used in silicon transistor technology. Such MOS structures are further susceptible to reduced channel strain imparted from source/drain due to poor mechanical coupling between source/drain and channel materials in non-planar transistor architectures, such as finFETs and nanowire configurations. This is because the source/drain and channel in such configurations share very little contact area which in turn minimizes the mechanical coupling between them. A lattice matched gate-channel interface to provide lattice continuity through at least the channel-dielectric interface or both the dielectric-electrode interface and the dielectric-electrode interface can be used to mitigate such problems, according to various embodiments of the present disclosure.

Use of the techniques and structures provided herein may be detectable, for example, using elemental mapping via secondary ion mass spectrometry, transmission electron microscopy (TEM), or atom probe tomography to look at composition profiles across the source/drain to confirm lattice matching and single crystal epitaxy across the channel/gate dielectric interface and possibly the gate dielectric/gate electrode interface. In addition, such tools may be used to identify the presence of specific elements at the interface via electron energy loss spectroscopy, EDX line scans or Z-contrast. Thus, for example, a TEM image of the gate structure can be used to show lattice continuity through the channel-dielectric interface, or through both the channel-dielectric interface and the dielectric-electrode interface. Numerous configurations will be apparent in light of this disclosure.

Methodology and Architecture

FIG. 1 illustrates a method for forming an integrated circuit including one or more MOS transistors configured with a gate stack lattice matched to channel material, in accordance with an embodiment of the present disclosure. Thus, the gate stack exhibit lattice continuity through the channel-dielectric interface in some embodiments, or both the channel-dielectric interface and the dielectric-electrode interface in other embodiments. FIGS. 2a through 2j illustrate example structures that are formed when carrying out the method of FIG. 1, in accordance with some such embodiments. While a non-planar transistor architecture is shown (fin-based transistors), the techniques provided herein can also be used with planar architecture. To this end, the side views of FIGS. 2a-j also represent example planar transistor embodiments. In any case, one or more such MOS transistors may be formed in the fabrication of, for example, a processor or a communication chip or a memory chip or any other integrated circuit having MOS transistors. Such integrated circuits can then be used in various electronic devices and systems, such as desktop and laptop computers, smartphones, tablet computers, and test equipment, to name a few examples. Numerous applications and functional circuits will be apparent.

Figure 2A:
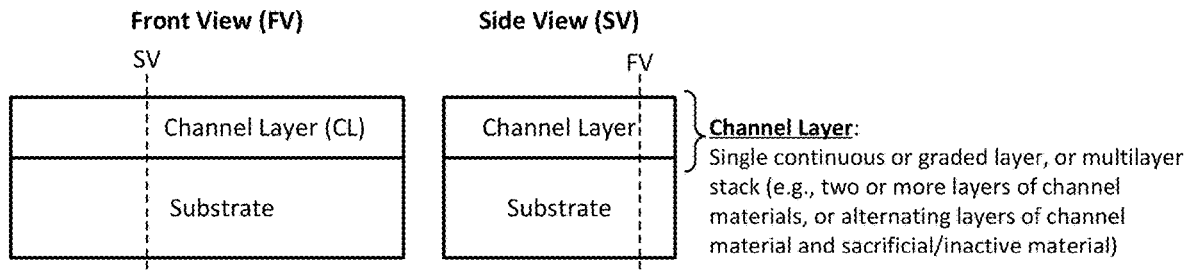
FIGS. 2a through 2j each illustrates front and side cross-sectional views of an integrated circuit structure formed during the method of FIG. 1, and that is configured in accordance with an embodiment of the present disclosure.

As can be seen, the example method includes depositing 101 an alternate semiconductor channel material on a substrate. The channel material is said to be alternate, because it is compositionally different from the underlying substrate material. In other embodiments, the channel layer need not be an alternate material (it can be native substrate material, doped or undoped). Further note that the channel material can be, for example, a single continuous layer of material, or a multilayer stack or structure, as will be discussed in turn. FIG. 2a shows an example resulting structure after the epitaxial deposition process to provision the channel layer, with the front view (FV) cross-section being on the left and the side view (SV) cross-section being on the right. With respect to FIGS. 2a-j, the front view cross-sections are taken perpendicular to the fins and through the drain region, and the side view cross-sections are taken through and parallel to a fin. The fins are not formed until FIG. 2b, and the source/drain regions are not formed until FIG. 2e, in this example process flow.

Any number of suitable substrates, including bulk substrates (e.g., group IV and III-V single crystal substrates), semiconductor-on-insulator substrates (XOI, where X is a group IV and III-V single crystal semiconductor material), and multi-layered structures including those substrates upon which fins or nanowires can be formed. In one specific example case, the substrate is a bulk single crystal silicon substrate. In another example case, the substrate is a silicon-on-oxide (SOI) substrate configuration that includes an oxide (e.g., silicon dioxide) disposed between a lower silicon wafer and an upper layer of single crystal silicon. Although a few example substrate materials and configurations are described here, numerous other suitable substrate materials and configurations that may serve as a foundation upon which a MOS transistor device may be built as variously provided herein will be apparent.

In accordance with some embodiments, the alternate channel material includes a single crystal semiconductor material from group IV or III-V. In one example case, a silicon substrate (e.g., bulk or SOI) is used, and the alternate channel material includes at least one of silicon, germanium, tin, indium, gallium, arsenic, or aluminum. Specific example group IV single crystal channel semiconductor materials include, for instance, germanium, tin, silicon germanium (SiGe), germanium:tin (GeSn), to name a few. Example group III-V single crystal channel semiconductor materials include, for instance, indium, gallium, arsenic, aluminum, gallium arsenide (GaAs), indium gallium arsenide (InGaAs), to name a few. In a more general sense, the channel material can be selected as desired, and the gate dielectric can be selected accordingly, to provide the desired degree of lattice match to that selected channel material.

As previously noted, the channel layer may be a single continuous layer of material. In some such embodiments, one or more components of that single continuous layer may be graded. For instance, in one example case, the channel layer is a single continuous layer of SiGe having a germanium concentration that is graded from about 20% or less at the substrate interface up to about 80% or higher at the gate dielectric interface. The thickness of the layer can be adjusted as needed. Channel layer doping, if desired, may also be graded. In still other embodiments, the channel material can be provided in the context of multilayer stacks that include, for example, one or more layers of different channel materials, or alternating layers of desired channel material and sacrificial/inactive material. Such multilayer configurations may be useful, for instance, for transistor structures that will include one or more nanowires in the channel and/or source/drain regions, as will be appreciated.

Figure 2B:
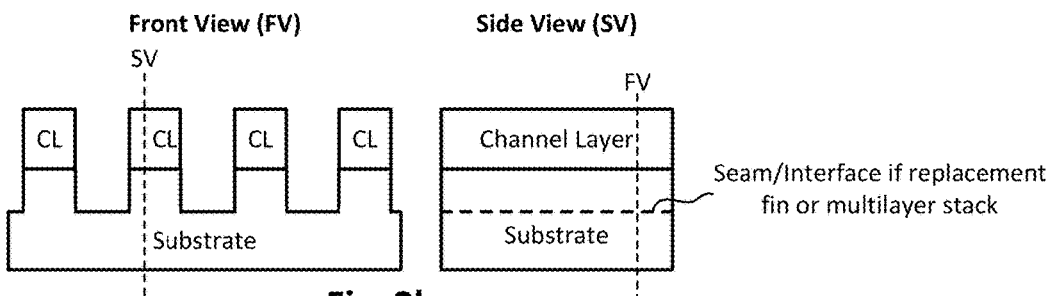

With further reference to the example embodiment of FIG. 1, the method continues with patterning and etching 103 the alternate channel material and substrate to form a plurality of fins. The resulting structure is shown in FIG. 2b. In this example case, the fin includes both the channel layer and a portion of the underlying substrate. In other embodiments, the fin may include only the channel layer, such that the fin etch process stops at the interface between the substrate and channel material. In still other embodiments, the fins can be formed using an aspect ratio trapping (ART) methodology, such as that described in U.S. Patent Application Publication 2014/0027860. In such cases, the channel material can be provided after so-called placeholder fins are formed. In more detail, the substrate can be patterned and etched into placeholder fins formed from the substrate material. Those fins are then encased in an insulator or other suitable material. The place holder fins can then selectively be recessed or otherwise removed and replaced with a desired channel material. In some such cases, the replacement channel material can be provided in the context of multilayer stacks that include alternating layers of desired channel material and sacrificial/inactive material, such as that described in U.S. Patent Application Publication 2016/0260802. In still other such cases, the multilayer stacks include two or more layers of channel materials. In any such cases, the various layers of the multilayer stack may have one or more graded components. As will be appreciated, grading can be used to facilitate a desired lattice matching scheme in the context of lattice-diverse materials, as will be appreciated.

Figure 2C:
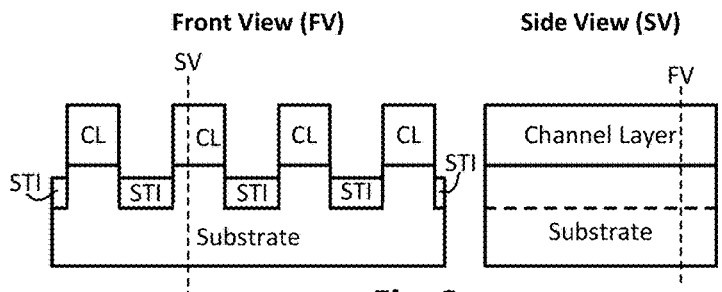

Thus, the fins may be, for example, native substrate material, or an alternate (not substrate) material, or a material stack, or some combination of these things. Note that the fins in reality may not be perfectly square as shown. Rather, the fins may have a tapered shape, such that each fin gets progressively thinner as the height of the fin increases. The fin widths can vary, depending on the process node, but in some embodiments are in the range of 3 nm to 30 nm wide, as measured at the widest part of the active channel portion of the fin. In any such cases, and with further reference to the example embodiment of FIG. 1, the method continues with filling 105 the trenches between the fins with shallow trench isolation (STI) material (e.g., silicon dioxide or other suitable insulator material), and then polishing and recessing that STI material. The resulting structure is shown in FIG. 2c. The recess depth of the STI material can be set as desired, and effectively defines the active channel portion of the fins. In this example case, the STI is recessed to just below the substrate channel layer (CL) interface. In other embodiments, the STI may be recessed to above that interface, or equal to that interface. In some example cases, for instance, the active channel portion of the fins is about 20 nm to 70 nm tall (from the top surface of the recessed STI to the top of the fin). The overall height of the fins can be, for example 100 nm to 350 nm, and the vertical thickness of the recessed STI material can be, for example, in the range of 50 nm to 300 nm.

Figure 2D:
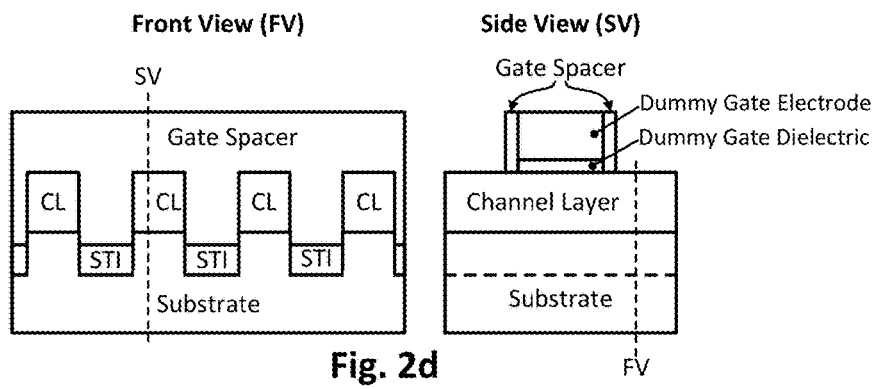

With further reference to the example embodiment of FIG. 1, the method continues with patterning and depositing 107 a gate spacer material, along with a dummy gate oxide and dummy gate electrode, which can be carried out as normally done. The resulting structure is shown in FIG. 2d. Note the dummy gate dielectric and electrode materials need not be single crystal materials or otherwise epitaxially deposited, as they are sacrificial in nature, given that this example embodiment is using a gate-last or so-called RMG (remove metal gate) process flow. In such cases, the real gate structure is added later in the process, after the source/drain processing has been carried out (and as will be discussed in turn). In this way, any sensitive gate materials (if any) are not subjected to the processing extremes (e.g., high temperature) associated with the source/drain processing. In other embodiments, the actual gate materials may be added at this point (for gate-first processes), if so desired and as will be appreciated. For purposes of describing this example embodiment, assume an RMG process.

The gate spacer may be formed, for example, using materials such as silicon oxide, silicon nitride, or other suitable gate spacer materials. The width of the gate spacers themselves may generally be chosen based on design requirements for the transistor being formed. The width between the gate spacers effectively defines the width of the gate electrode and gate dielectric, and may be in the range of, for example, 10 nm to 500 nm. The dummy gate dielectric material can be, for example, silicon dioxide, and can be for example 0.5 nm to 10 nm thick (so as to define distance between the channel and gate electrode). The dummy electrode material can be, for example, polysilicon, silicon nitride, silicon carbide, or a metal layer (e.g., tungsten, titanium nitride, tantalum, tantalum nitride) although other suitable dummy materials can be used as well. The thickness (height) of the gate electrode material may be, for example, in the range of about 10 nm to 200 nm. Numerous dummy gate stack configuration can be used.

Figure 2E:
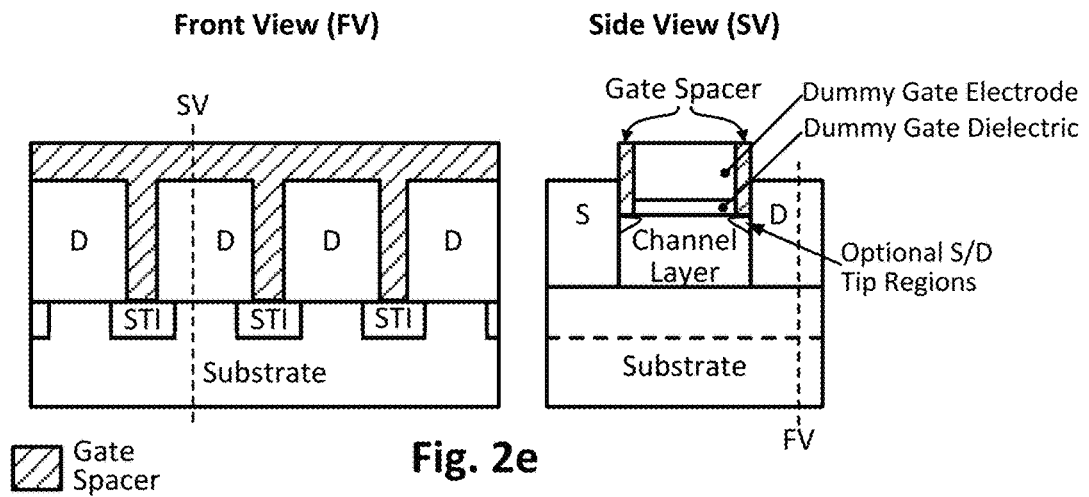

With further reference to the example embodiment of FIG. 1, the method continues with etching 109 the fin to remove the source/drain regions, and then depositing a desired source/drain material. The resulting structure is shown in FIG. 2e. The source/drain regions can be doped in situ, or after the deposition process (e.g., via ion implantation and annealing). This embodiment assumes a replacement source/drain scheme. However, other embodiments may utilize the given fin material(s) to form the source/drain regions, and employ one or more doping techniques (e.g., ion implantation and annealing) to form the source/drain regions, as sometimes done. In still other embodiments, the source/drain regions are processed to form one or more nanowires therein, such as described in U.S. Patent Application Publication 2016/0260802. The source/drain regions can either be p-doped (for PMOS devices) or n-doped (for NMOS devices). The source/drain region material may include any number of group IV and/or III-V materials, and may include single layer or multilayer structures (e.g., bi-layer structure including a liner and capping layer), and may further include one or more components that are graded (e.g., boron-doped SiGe have a graded concentration of both germanium and boron). In some embodiments, the source/drain regions include tip regions that extend under the gate spacer, or both the gate spacer and the gate dielectric (such as shown in the side view of FIG. 2e). In some embodiments, the source/drain regions may be raised relative to the channel region (in the vertical y-direction), such that the top of the source/drain regions (not counting the source/drain contact structure) is higher than the top of the channel layer (such as shown in the side view of FIG. 2e). Likewise, the source/drain regions may be wider (in the lateral x-direction) than the channel regions, in some embodiments (such as shown in the front view of FIG. 2e). Any number of suitable source/drain configurations can be used, as will be appreciated in light of this disclosure, and the present disclosure is not intended to be limited to any particular S/D scheme.

Figure 2F:
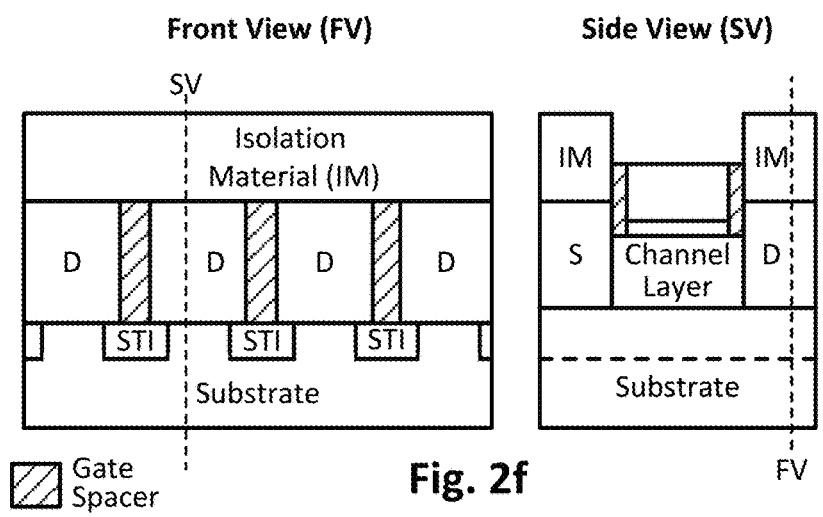
Figure 2G:
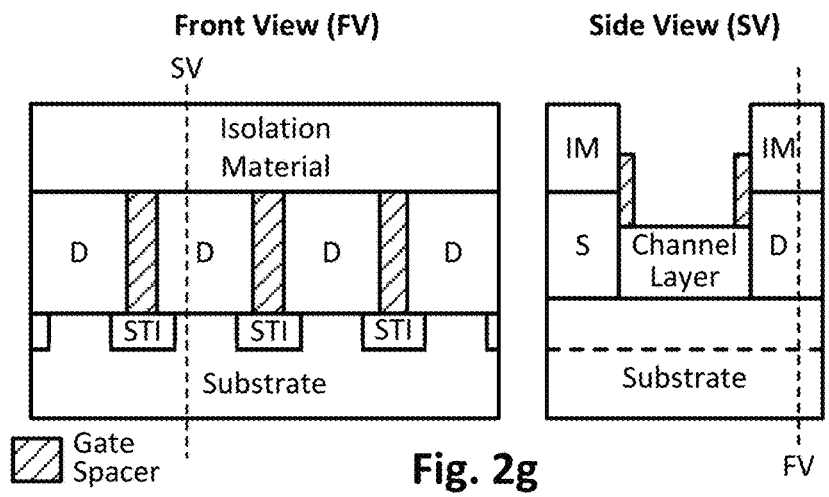

With further reference to the example embodiment of FIG. 1, the method continues with at 111 with depositing fill/isolation material followed by patterning and recessing that material to expose the underlying gate dummy gate structure. Standard deposition, patterning, and etching can be used. The resulting structure is shown in FIG. 2f, which shows the exposed dummy gate structure. The method continues with removing 113 the dummy gate material(s), which in this example case include the dummy gate dielectric and dummy gate electrode materials. Standard etch techniques can be used, and may include patterning and/or selective etch chemistries. The resulting structure after dummy gate removal is shown in FIG. 2g.

Figure 2H:
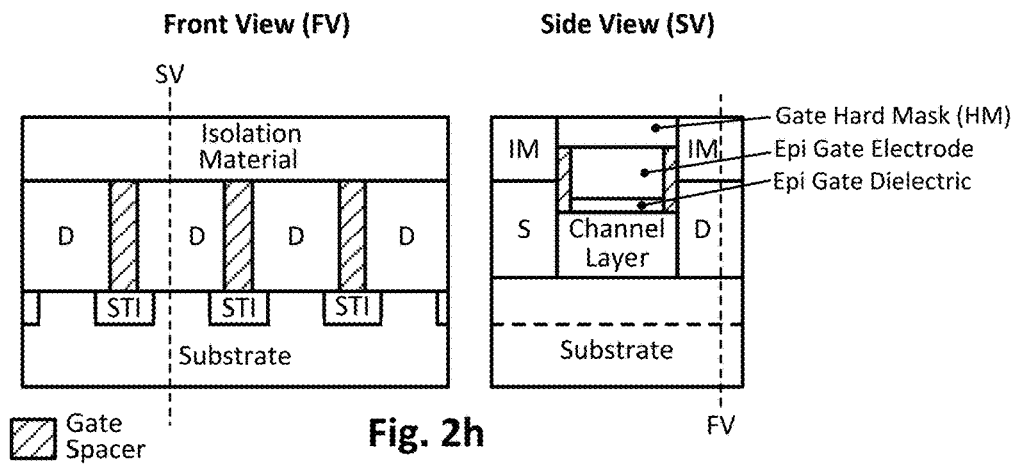

The method continues with depositing 115 epitaxial single crystal gate dielectric material that is lattice matched to the underlying single crystal channel layer. The method may further include, in some embodiments, depositing epitaxial single crystal gate electrode material that is also lattice matched to the underlying single crystal channel layer, on the single crystal gate dielectric material. The method may further include depositing a hard mask over the gate structure. The resulting structure according to some such embodiments is shown in FIG. 2h.

The optional hard mask can be used to provide certain benefits or uses during processing, such as protecting the gate electrode from subsequent etch and/or ion implantation processes (e.g., during a gate-first process, as previously noted). The hard mask may be formed using typical hard mask materials, such as silicon dioxide, silicon nitride, and/or other suitable mask materials. In some such example embodiments, the hard mask may include a bi-layer structure to facilitate a desired etch scheme including diverse etch rates.

Example single crystal gate dielectric materials include, for instance, an oxide or nitride material including strontium, titanium, lanthanum, aluminum, neodymium, lutetium, or gadolinium, or a combination thereof such as strontium titanate ($SrTiO_3$), lanthanum aluminate ($LaAlO_3$), neodymium aluminate ($NdAlO_3$), gadolinium aluminate ($GdAlO_3$), to name a few. Example single crystal gate electrode materials include, for instance, a doped semiconductor including silicon, germanium, indium, arsenic, gallium, aluminum, or some alloy or compound thereof. The dopant can be, for example, phosphorous, arsenic, antimony, boron, aluminum, or silicon. Alternatively, other single crystal gate electrode materials include, for example, a lattice matched metal containing nickel, titanium, and cobalt. Specific example single crystal gate electrode materials include nickel silicide ($NiSi_2$), cobalt silicide ($CoSi_2$), and silicon germanium (SiGe) doped with phosphorous or boron. Numerous materials systems will be appreciated in light of this disclosure. The deposition can be carried out using standard epitaxy.

Figure 5:
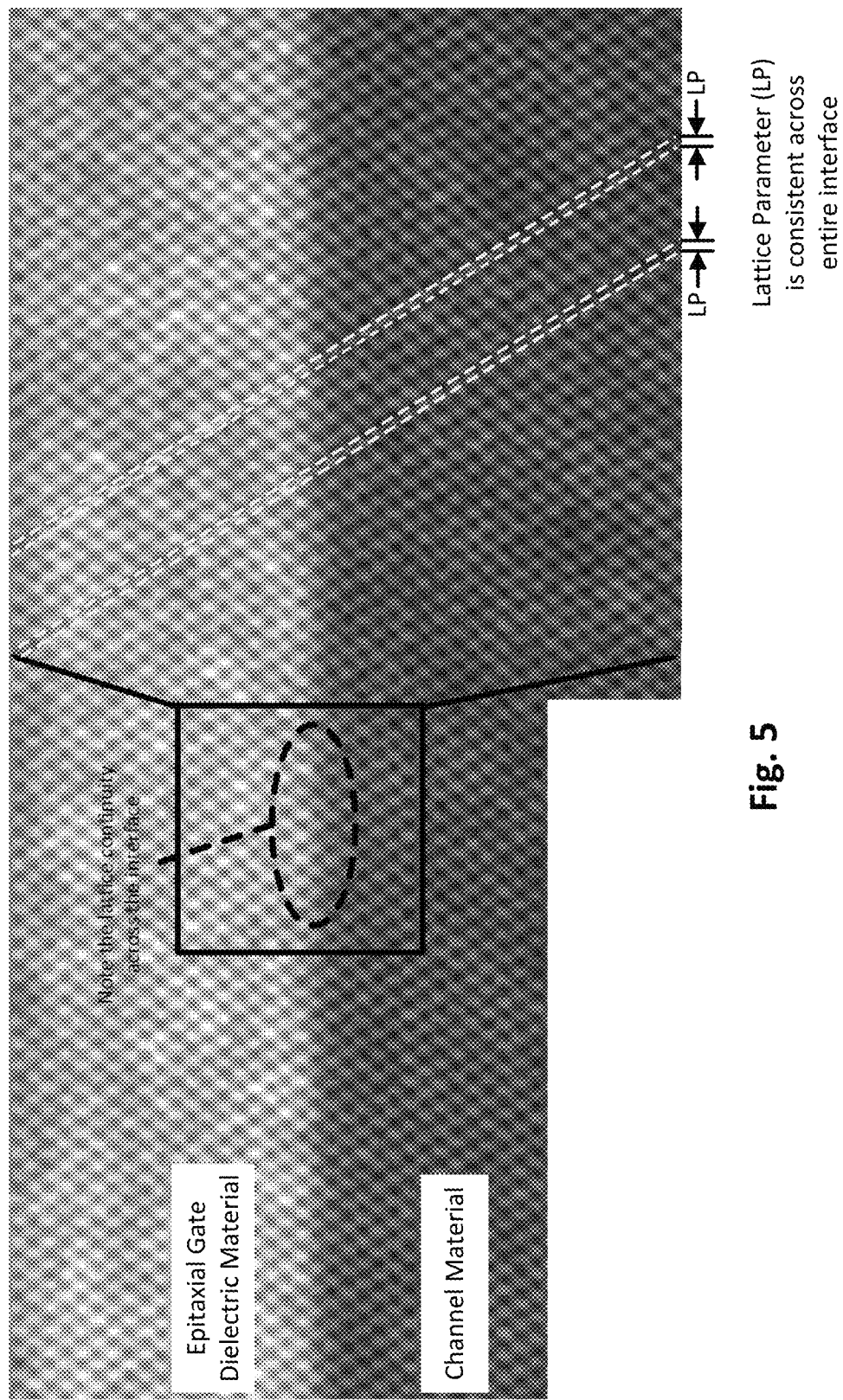
FIG. 5 illustrates an atomic resolution transmission electron microscopy (TEM) showing a lattice matched interface between a gate dielectric material and a channel material, in accordance with some embodiments of the present disclosure.

As previously explained, the epitaxial deposition of single crystal gate dielectric material that is lattice matched to the channel material allows for lattice continuity through the channel-dielectric interface. Likewise, the epitaxial deposition of single crystal gate electrode material that is also lattice matched to the channel material allows for lattice continuity through the dielectric-electrode interface. FIG. 5 illustrates an atomic resolution transmission electron microscopy (TEM) showing a lattice matched interface between a gate dielectric material and a channel material, in accordance with some embodiments of the present disclosure. As can be seen, the atoms of each material form a diagonal line that continues through each of the two different layers. Two sets of neighboring diagonal lines (annotated with a line overlaid on the image) each define a spacing (LP) between the respective neighboring lines. This spacing is the lattice parameter, and remains substantially constant the entire length of the diagonal, as can be seen in the SEM image. According to some embodiments, the lattice parameter of the gate dielectric material is within +/−2% of the lattice parameter of the channel material. In some such embodiments, the lattice parameter of the gate electrode material is also within +/−2% of the lattice parameter of the channel material, although in other embodiments, such lattice matching of the gate electrode material relative to the channel material is not needed. In still other embodiments, the gate dielectric material and possibly the gate electrode material can be lattice matched to the channel material if their respective lattice parameters are otherwise within an acceptable tolerance so as to allow for lattice continuity across the entire channel-dielectric interface (and possibly, the entire dielectric-electrode interface, in some embodiments).

Figure 2I:
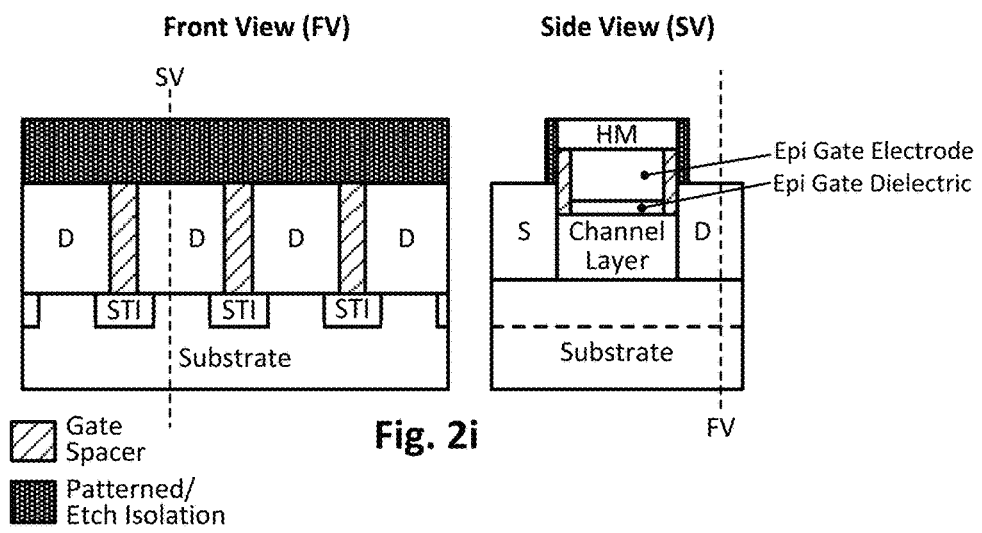
Figure 2J:
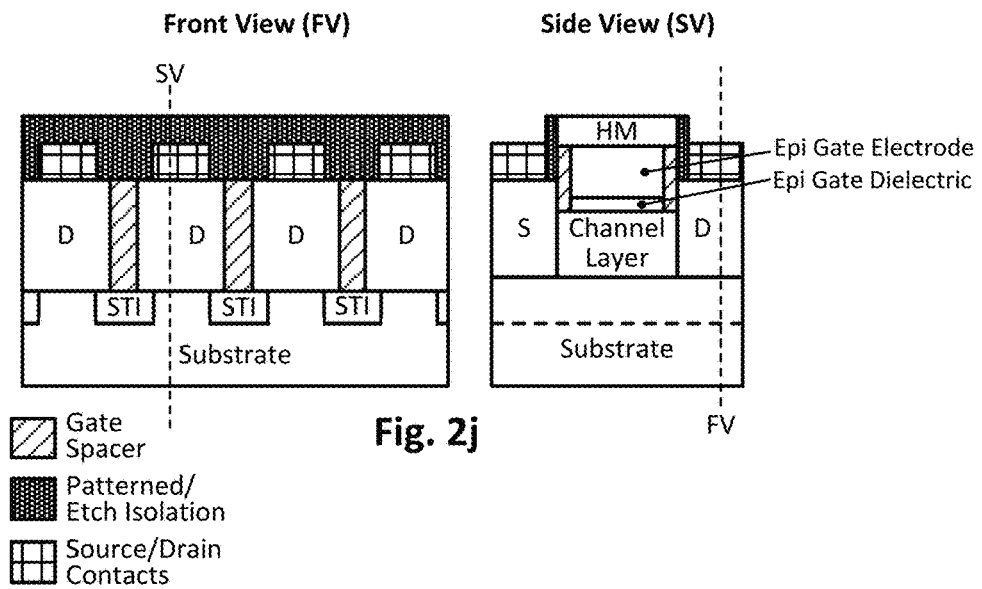

The method continues with patterning and recessing 117 the fill/isolation to expose the underlying source/drain regions. Standard patterning and etching can be used. The resulting structure is shown in FIG. 2i. The method continues with depositing 119 source/drain contacts. Standard contact forming techniques can be used, and may include the provisioning of barrier/liner layers, resistance-reducing layers, and work function tuning layers. The resulting structure is shown in FIG. 2j. The method may continue with further typical processing as needed, including any back-end processing such as interconnect formation. For instance, the structure shown in FIG. 2j can be planarized (e.g., chemical mechanical planarization process) to remove the gate hard mask and excess gate spacer material. Then, an interlayer dielectric (ILD) layer can then be provided, patterned, and etched to provide various recesses that can then be metallized to form the first metal interconnect layer. Multiple such layers can be formed, as needed (e.g., metal layers M0 through M9).

Figure 3A:
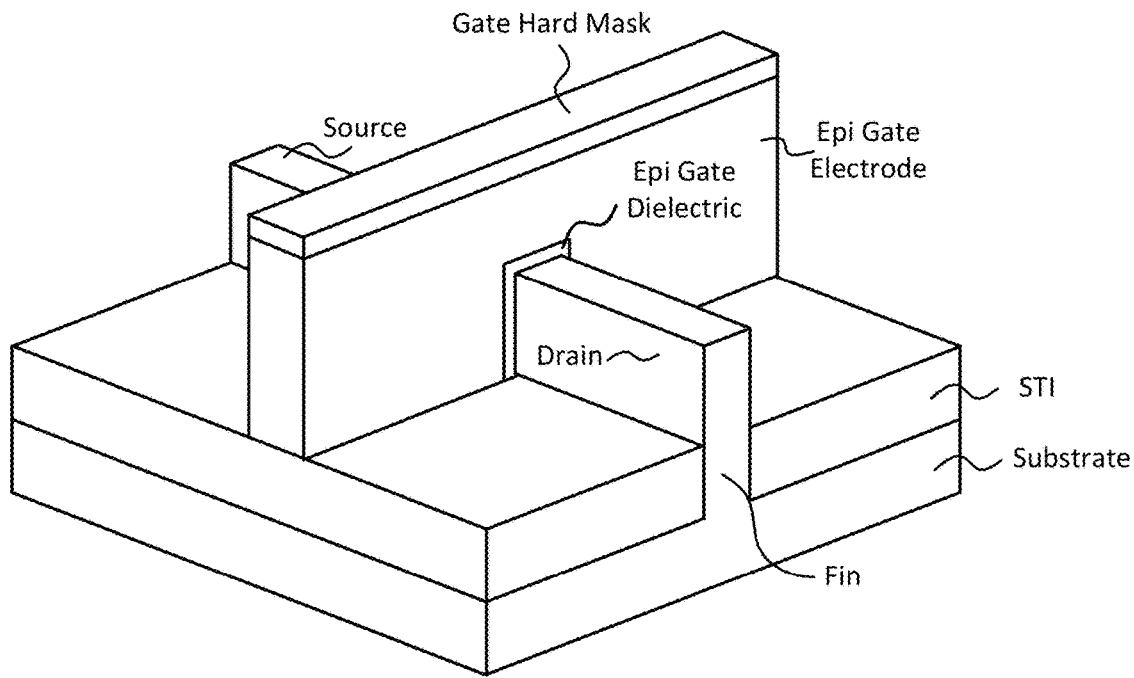
FIGS. 3a and 3b each illustrates a perspective view of an integrated circuit structure formed during the method of FIG. 1, and that is configured in accordance with an embodiment of the present disclosure.
Figure 3B:
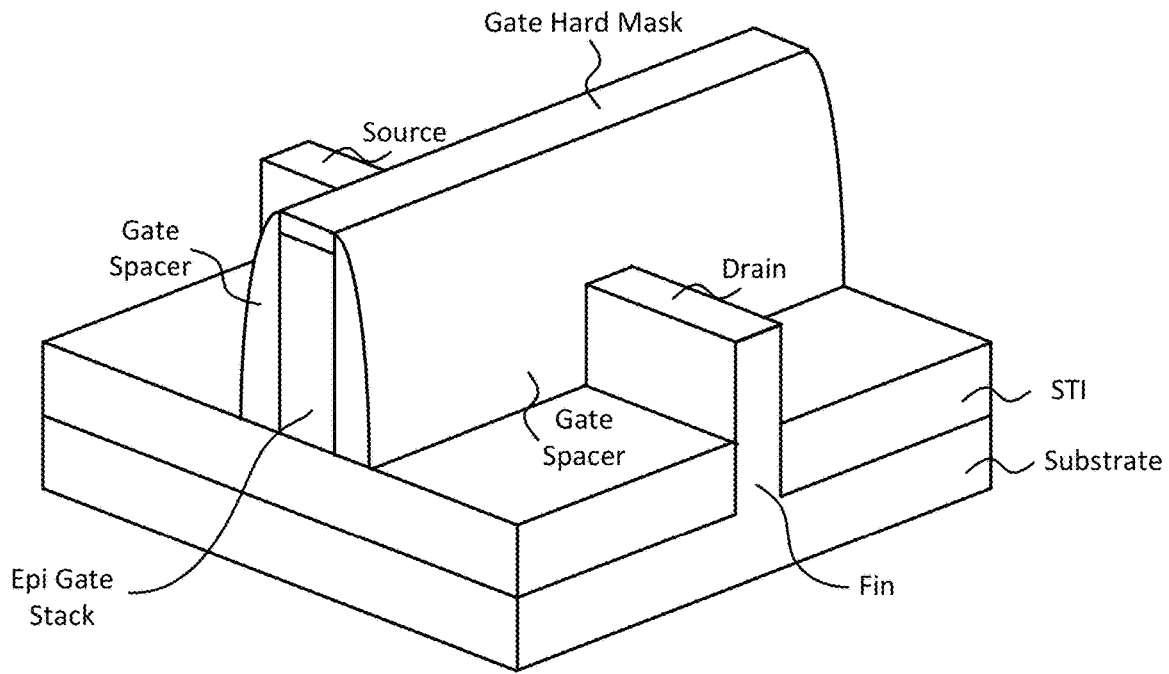

FIGS. 3a and 3b each illustrates a perspective view of an integrated circuit structure formed during the method of FIG. 1, and that is configured in accordance with an embodiment of the present disclosure. Such perspective views can be helpful with respect to non-planar architecture, but as previously explained, other embodiments may utilize planar transistor architecture. The previous discussion with respect to FIGS. 1 and 2a-2j is equally applicable here, as will be appreciated. As can be seen, the example non-planar configuration shown in FIG. 3a includes a substrate having a semiconductor body or fin extending from the substrate through a shallow trench isolation (STI) layer. The portion of the fin above the STI layer effectively forms the channel of the transistor device and is single crystal semiconductor. Recall, the channel portion of the fin may be native to the substrate or an alternative channel material.

As can be further seen in FIG. 3a, a gate dielectric material is provided between the fin and a gate electrode, and hard mask is formed on top of the gate electrode. Note that the gate electrode is formed over three surfaces of the fin to form three gates (hence, a tri-gate device). In this example embodiment, the gate dielectric material and the gate electrode material are both epitaxial (sometimes called epi) layers and are single crystal materials that are lattice matched to the channel material making up the channel portion of the fin. In other embodiments, just the gate dielectric is epitaxial and lattice matched to the single crystal channel material making up the channel portion of the fin. Reference herein to epi gate or epi gate structure is intended to cover both such configurations. FIG. 3b illustrates the resulting structure after deposition of insulating material and subsequent etch that leaves a coating of the insulator material on the vertical surfaces of the gate stack (which includes the gate dielectric, gate electrode, and gate hard mask, in this example case), so as to provide the gate spacers.

As previously explained, the source/drain regions can be formed in the originally provided fin structure in some embodiments. Alternatively, in other embodiments, the source/drain regions are formed by an etch-and-replace process. Such an etch-and-replace process may be used to provide a single layer or a multilayer source/drain structure. For instance, FIG. 4a illustrates an example transistor structure after growth of an epitaxial source/drain liner and cap configuration in the source/drain regions. The epitaxial liner may be, for example, a thin p-type or n-type silicon-containing (e.g., silicon or SiGe having 70 atomic % silicon) liner, or a pure germanium (e.g., a separate layer of germanium, or a non-detectable layer that is integrated or otherwise included in the composition of the caps). The epitaxial cap can be, for example, p-type or n-type and comprise primarily germanium but may contain less than 20 atomic % tin, according to some embodiments. Numerous other source/drain configurations and material systems can be used, as will be appreciated.

As will further be appreciated, note that an alternative to the tri-gate configuration as shown is a double-gate architecture, which would include a dielectric/isolation layer on top of the fin, such that the gate resides predominately on the two opposing sides of the fin (again, above the STI region). Further note that the example shapes of the epitaxial materials making up the source/drain regions in this example case are not intended to limit the present disclosure to such shapes; rather, other source/drain configurations and shapes will be apparent in light of this disclosure (e.g., round, square or rectangular source/drain regions may be implemented, whether they be single layer or multilayer, raised, flush, or recessed relative to the top of the channel layer).

FIG. 4b shows a perspective view of a nanowire transistor structure formed in accordance with one embodiment of the present disclosure. A nanowire transistor (sometimes referred to as gate-all-around FET) is configured similarly to a fin-based transistor, but instead of a fin, a nanowire is used and the gate material generally surrounds the channel region on all sides. Depending on the particular design, some nanowire transistors have, for instance, four effective gates. This example embodiment includes two nanowires (generally designated as wire, and is intended to include ribbons and nanowires, depending on aspect ratio), although other embodiments can have any number of wires. The nanowires can be implemented, for example, with p-type (e.g., boron-doped) or n-type (e.g., phosphorous-doped) silicon or germanium or SiGe or III-V nanowires. As can be seen, one nanowire is formed or otherwise provided on a pedestal of the substrate and the other nanowire effectively floats in the source/drain material, which in this example embodiment is a bi-layer construction comprising liner and cap. Other embodiments may have a recess in the substrate in which the nanowire is formed (rather than on a pedestal). In addition, just as with the fin configuration shown in FIG. 4a, note that the nanowires can be replaced in the source/drain regions with a single layer or a bi-layer construction of source/drain material as described herein (e.g., relatively thin silicon or germanium or SiGe liner and relatively thick high concentration germanium cap). Alternatively, the bi-layer construction can be provided around the originally formed nanowire as shown (where the liner is provided around the nanowire, and the cap is then provided around the liner). Alternatively, a single layer construction can be provided around the originally formed nanowire.

FIG. 4c also illustrates another example nanowire configuration having multiple nanowires, but in this example case, inactive material (IM) is not removed from between the individual nanowires during the nanowire forming process, which can be carried out using various conventional techniques. Thus, one nanowire is provided on a pedestal (or recess) of substrate and the other nanowire effectively sits on top of the inactive material. Note the nanowires are active through the channel, but the inactive material is not. As can be seen, the bi-layer source/drain construction of liner and cap is provided around all other exposed surfaces of the nanowires. In other embodiments, a single layer source/drain construction is provided around all other exposed surfaces of the nanowires.

Example Lattice Matched Material Systems

As will be appreciated, numerous example embodiments can be formed in accordance with the present disclosure. A few specific example embodiments will now be provided. These examples are not intended to limit the present disclosure; rather, they are provided to simply show example use cases. Numerous will be apparent. Although each of these example cases is provided with a single crystal gate electrode that is lattice matched to the channel, alternative embodiments include the same examples but without the lattice matched gate electrode. In such alternative cases, note that the gate electrode can be any suitable gate electrode material or structure, and need not be lattice matched to the channel material.

Example A includes: a bulk single crystal silicon substrate or SOI structure on a silicon wafer; a channel layer of single crystal SiGe; a gate dielectric of single crystal $SrTiO_3$; a gate electrode of single crystal $NiSi_2$; a gate spacer of silicon dioxide ($SiO_2$); source/drain regions including boron-doped SiGe (SiGe:B) (e.g., ~20-50% Ge); and an STI/insulator fill of $SiO_2$.

Example B includes: a bulk single crystal silicon substrate or SOI structure on a silicon wafer; a channel layer of single crystal germanium; a gate dielectric of single crystal yttrium lanthanum oxide $(LaY)_2O_3$; a gate electrode of single crystal gallium arsenide silicate; a gate spacer of silicon nitride (SiN); source/drain regions including SiGe:B (e.g., ~20-50% germanium); and an STI/insulator fill of $SiO_2$.

Example C includes: a bulk single crystal silicon substrate or SOI structure on a silicon wafer; a channel layer of single crystal GaAs; a gate dielectric of single crystal lanthanum oxide ($La_2O_3$); a gate electrode of single crystal silicon-doped GaAs (GaAs:Si); a gate spacer of SiN; source/drain regions including GaAs:Si; and an STI/insulator fill of $SiO_2$.

Example D includes: a bulk single crystal silicon substrate or SOI structure on a silicon wafer; a channel layer of single crystal SiGe; a gate dielectric of single crystal yttrium gadolinium oxide ($YGdO_3$); a gate electrode of single crystal cobalt silicide ($CoSi_2$); a gate spacer of SiN; source/drain regions including SiGe:B (e.g., ~20-50% germanium); and an STI/insulator fill of $SiO_2$.

Example E includes: a bulk single crystal silicon substrate or SOI structure on a silicon wafer; a channel layer of single crystal silicon; a gate dielectric of single crystal $LaAlO_3$; a gate electrode of single crystal $NiSi_2$; a gate spacer of $SiO_2$; source/drain regions including phosphorous-doped silicon (Si:P); and an STI/insulator fill of $SiO_2$.

Example F includes: a bulk single crystal silicon substrate or SOI structure on a silicon wafer; a channel layer of single crystal SiGe; a gate dielectric of single crystal lanthanum lutetium oxide ($LaLuO_3$); a gate electrode of single crystal $NiSi_2$; a gate spacer of $SiO_2$; source/drain regions including SiGe:B; and an STI/insulator fill of $SiO_2$.

Note that dimensions provided herein are simply examples only, and not intended to limit the present disclosure in any way. Further note that standard patterning and selective etch processes (including wet and/or dry etch schemes) can be used to form the various structures provided herein. Likewise, except for the single crystal lattice matched materials, which are deposited via epitaxy to form a continuous crystal structure as variously provided herein, other materials can be deposited using any suitable conventional deposition processes such as chemical vapor deposition (CVD), atomic layer deposition (ALD), spin-on deposition (SOD), or physical vapor deposition (PVD), thermal growth, oxidation based growth, electroless plating, and electroplating, to name a few. Standard processing parameters can be used.

Example Computing System

Figure 6:
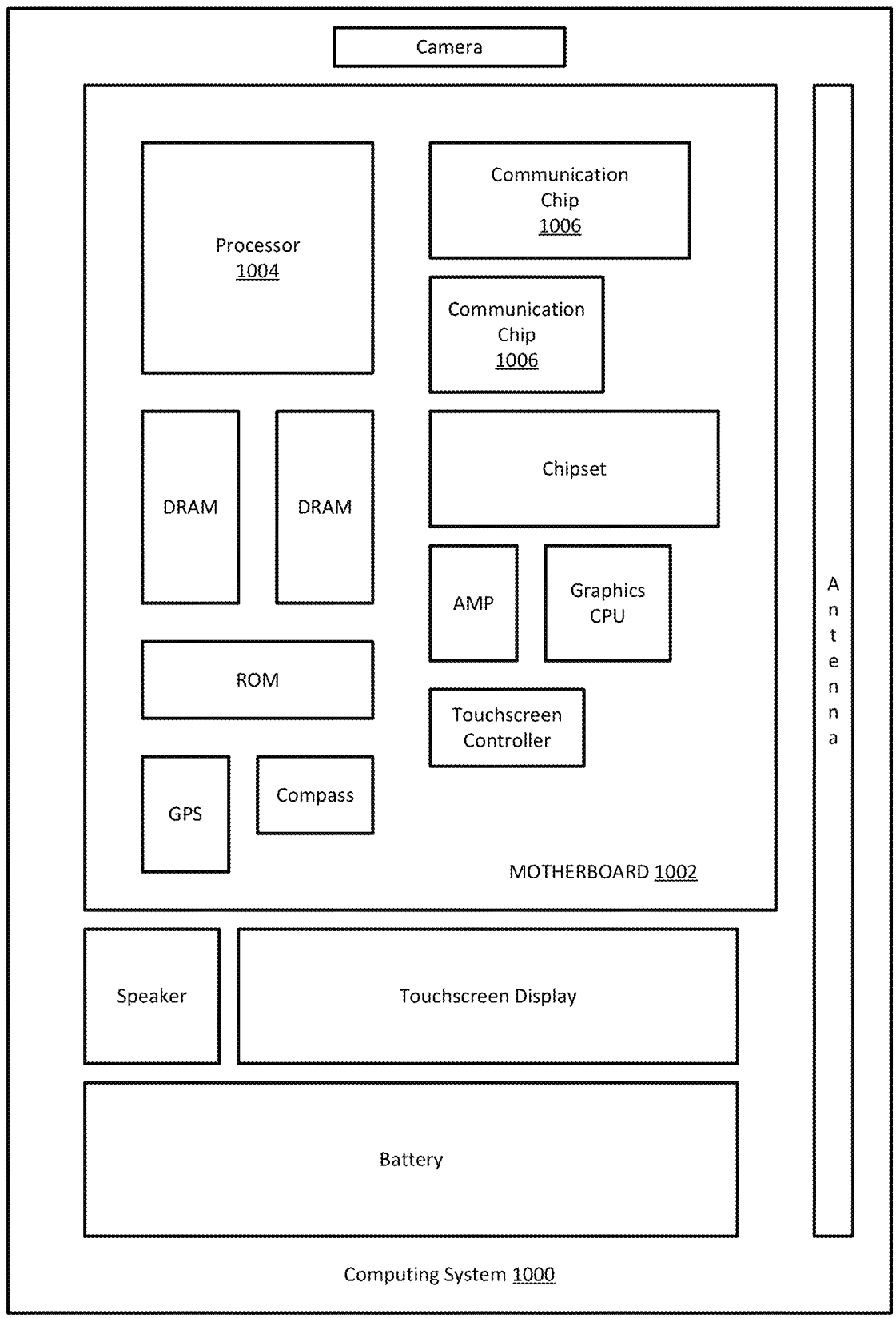
FIG. 6 is an example computing system including one or more of the integrated circuit structures configured in accordance with some embodiments of the present disclosure.

FIG. 6 is an example computing system including one or more of the integrated circuit structures configured in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., MOS transistors configured with a gate dielectric that is lattice matched to the channel layer). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some example embodiments, communication chip 1006 may include one or more MOS transistor devices each having a gate stack that is lattice matched to its channel layer, as variously provided herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server computer system, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit transistor structure, comprising: a channel region including single crystal semiconductor material; a gate dielectric layer directly on the channel region and including a single crystal gate dielectric material that is lattice matched to the single crystal semiconductor material; and source and drain regions proximate the channel region, such that the channel region is between the source and drain regions.

Example 2 includes the subject matter of Example 1, and further includes a gate electrode directly on the gate dielectric layer.

Example 3 includes the subject matter of Example 2, wherein the gate electrode includes a single crystal material that is lattice matched to the single crystal semiconductor material.

Example 4 includes the subject matter of Example 3, wherein the gate electrode material includes one or more of a single crystal elemental metal, a single crystal alloyed metal, and a doped single crystal semiconductor.

Example 5 includes the subject matter of Example 3 or 4, wherein the gate electrode material includes a doped single crystal semiconductor doped with one or more of phosphorous, arsenic, antimony, boron, aluminum, and silicon.

Example 6 includes the subject matter of Example 2, wherein the gate electrode includes an amorphous or polycrystalline material.

Example 7 includes the subject matter of any of the preceding Examples, and further includes source and drain contact structures in contact with the source and drain regions, respectively.

Example 8 includes the subject matter of any of the preceding Examples, and further includes a substrate.

Example 9 includes the subject matter of Example 8, wherein the substrate is a single crystal bulk semiconductor substrate, or a semiconductor-on-insulator substrate having a single crystal semiconductor layer.

Example 10 includes the subject matter of Example 8 or 9, wherein the substrate is a bulk silicon substrate or a silicon-on-insulator substrate.

Example 11 includes the subject matter of any of Examples 8 through 10, wherein the channel region is compositionally different from the substrate.

Example 12 includes the subject matter of any of the preceding Examples, wherein the single crystal semiconductor material of the channel region includes one or more of silicon, germanium, tin, indium, gallium, arsenic, and aluminum.

Example 13 includes the subject matter of any of the preceding Examples, wherein the single crystal gate dielectric material includes one or more of strontium, titanium, lanthanum, aluminum, neodymium, lutetium, and gadolinium.

Example 14 includes the subject matter of any of the preceding Examples, wherein the single crystal gate dielectric material includes at least one of a single crystal high-k dielectric, a single crystal oxide, and a single crystal nitride.

Example 15 includes the subject matter of any of the preceding Examples, wherein the transistor structure is a non-planar transistor structure, such that the channel region includes at least one of a fin and a nanowire.

Example 16 includes the subject matter of any of the preceding Examples, wherein the source and drain regions each includes at least one of a fin and a nanowire.

Example 17 includes the subject matter of any of the preceding Examples, wherein the transistor structure is included in a central processing unit, a memory, or a wireless communication chip.

Example 18 includes the subject matter of any of the preceding Examples, wherein the transistor structure is included in one of a stationary computing system, a mobile computing system, or test equipment.

Example 19 includes the subject matter of any of the preceding Examples, wherein the single crystal semiconductor material has a first lattice parameter and the single crystal gate dielectric material has a second lattice parameter that is within +/−2% of the first lattice parameter.

Example 20 includes the subject matter of any of the preceding Examples, wherein the single crystal semiconductor material of the channel region has a first lattice parameter and the single crystal gate dielectric material has a second lattice parameter that is within a tolerance of the first lattice parameter such that there is lattice continuity across the entire interface between the single crystal channel material and the single crystal gate dielectric material.

Example 21 is an integrated circuit transistor structure, comprising: a channel region including single crystal semiconductor material; a gate dielectric layer directly on the channel region and including a single crystal gate dielectric material that is lattice matched to the single crystal semiconductor material; a gate electrode directly on the gate dielectric layer and including a single crystal material that is lattice matched to the single crystal semiconductor material; source and drain regions proximate the channel region, such that the channel region is between the source and drain regions; and source and drain contact structures in contact with the source and drain regions, respectively; wherein the single crystal semiconductor material of the channel region has a first lattice parameter and each of the single crystal gate dielectric material and the single crystal gate electrode material has a lattice parameter that is within a tolerance of the first lattice parameter, such that there is lattice continuity across the interface between the single crystal channel material and the single crystal gate dielectric material, as well as across the interface between the single crystal gate dielectric material and the single crystal gate electrode material.

Example 22 includes the subject matter of Example 21, wherein the gate electrode material includes one or more of a single crystal elemental metal, a single crystal alloyed metal, and a doped single crystal semiconductor.

Example 23 includes the subject matter of Example 21 or 22, wherein the gate electrode material includes a doped single crystal semiconductor doped with one or more of phosphorous, arsenic, antimony, boron, aluminum, and silicon.

Example 24 includes the subject matter of any of Examples 21 through 23, wherein the single crystal semiconductor material of the channel region includes one or more of silicon, germanium, tin, indium, gallium, arsenic, and aluminum.

Example 25 includes the subject matter of any of Examples 21 through 23, wherein the single crystal gate dielectric material includes one or more of strontium, titanium, lanthanum, aluminum, neodymium, lutetium, and gadolinium.

Example 26 includes the subject matter of any of Examples 21 through 25, wherein the single crystal gate dielectric material includes at least one of a single crystal high-k dielectric, a single crystal oxide, and a single crystal nitride.

Example 27 includes the subject matter of any of Examples 21 through 26, wherein the transistor structure is a non-planar transistor structure, such that the channel region includes at least one of a fin and a nanowire.

Example 28 includes the subject matter of any of Examples 21 through 27, wherein the source and drain regions each includes at least one of a fin and a nanowire.

Example 29 includes the subject matter of any of Examples 21 through 28, wherein the tolerance is +/−2%.

Example 30 includes the subject matter of any of Examples 21 through 29, wherein the transistor structure is included in a central processing unit, a memory, or a wireless communication chip.

Example 31 includes the subject matter of any of Examples 21 through 30, wherein the transistor structure is included in one of a stationary computing system, a mobile computing system, or test equipment.

Example 32 includes a method for forming an integrated circuit transistor structure, the method comprising: epitaxially depositing a channel region including single crystal semiconductor material; epitaxially depositing a gate dielectric layer directly on the channel region and including a single crystal gate dielectric material that is lattice matched to the single crystal semiconductor material; and providing source and drain regions proximate the channel region, such that the channel region is between the source and drain regions.

Example 33 includes the subject matter of Example 32, and further includes providing a gate electrode directly on the gate dielectric layer.

Example 34 includes the subject matter of Example 33, wherein providing the gate electrode includes epitaxially depositing a single crystal material that is lattice matched to the single crystal semiconductor material.

Example 35 includes the subject matter of Example 33 or 34, wherein the gate electrode material includes one or more of a single crystal elemental metal, a single crystal alloyed metal, and a doped single crystal semiconductor.

Example 36 includes the subject matter of any of Examples 33 through 35, wherein the gate electrode material includes a doped single crystal semiconductor doped with one or more of phosphorous, arsenic, antimony, boron, aluminum, and silicon.

Example 37 includes the subject matter of Example 33, wherein the gate electrode includes an amorphous or polycrystalline material.

Example 38 includes the subject matter of any of Examples 32 through 37, and further includes providing source and drain contact structures in contact with the source and drain regions, respectively.

Example 39 includes the subject matter of any of Examples 32 through 38, wherein the single crystal semiconductor material of the channel region includes one or more of silicon, germanium, tin, indium, gallium, arsenic, and aluminum.

Example 40 includes the subject matter of any of Examples 32 through 39, wherein the single crystal gate dielectric material includes one or more of strontium, titanium, lanthanum, aluminum, neodymium, lutetium, and gadolinium.

Example 41 includes the subject matter of any of Examples 32 through 40, wherein the single crystal gate dielectric material includes at least one of a single crystal high-k dielectric, a single crystal oxide, and a single crystal nitride.

Example 42 includes the subject matter of any of Examples 32 through 41, wherein the transistor structure is a non-planar transistor structure, such that the channel region includes at least one of a fin and a nanowire.

Example 43 includes the subject matter of any of Examples 32 through 42, wherein the source and drain regions each includes at least one of a fin and a nanowire.

Example 44 includes the subject matter of any of Examples 32 through 43, wherein the single crystal semiconductor material has a first lattice parameter and the single crystal gate dielectric material has a second lattice parameter that is within +/−2% of the first lattice parameter.

Example 45 includes the subject matter of any of Examples 32 through 43, wherein the single crystal semiconductor material of the channel region has a first lattice parameter and the single crystal gate dielectric material has a second lattice parameter that is within a tolerance of the first lattice parameter such that there is lattice continuity across the entire interface between the single crystal channel material and the single crystal gate dielectric material.

Example 46 includes the subject matter of Example 45, wherein the tolerance is +/−2%.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising:
   a substrate comprising a first single crystal semiconductor material;
   a semiconductor region directly on the substrate, the semiconductor region including a second single crystal semiconductor material different from the first single crystal semiconductor material;
   a gate dielectric layer directly on the semiconductor region and including a single crystal dielectric material that is lattice matched to the single crystal semiconductor material; and
   a source region and a drain region, the semiconductor region being between the source and drain regions.

2. The integrated circuit structure of claim 1, further comprising a gate electrode on the gate dielectric layer.

3. The integrated circuit structure of claim 2, wherein the gate electrode includes a single crystal material that is lattice matched to the second single crystal semiconductor material.

4. The integrated circuit structure of claim 3, wherein the gate electrode material includes one, two, or all three of a single crystal elemental metal, a single crystal alloyed metal, and a doped single crystal semiconductor.

5. The integrated circuit structure of claim 3, wherein the gate electrode material includes a doped single crystal semiconductor doped with one or more of phosphorous, arsenic, antimony, boron, aluminum, and silicon.

6. The integrated circuit structure of claim 2, wherein the gate electrode includes an amorphous or polycrystalline material.

7. The integrated circuit structure of claim 1, further comprising:
   source and drain contact structures in contact with the source and drain regions, respectively.

8. The integrated circuit structure of claim 1, wherein the second single crystal semiconductor material of the semiconductor region includes one or more of silicon, germanium, tin, indium, gallium, arsenic, and aluminum.

9. The integrated circuit structure of claim 1, wherein the single crystal dielectric material includes one or more of strontium, titanium, lanthanum, aluminum, neodymium, lutetium, and gadolinium.

10. The integrated circuit structure of claim 1, wherein the single crystal dielectric material includes one, two, or all three of a single crystal high-k dielectric, a single crystal oxide, and a single crystal nitride.

11. The integrated circuit structure of claim 1, wherein the semiconductor region includes one or both of a fin and a nanowire.

12. The integrated circuit structure of claim 1, wherein the source and drain regions each includes one or both of a fin and a nanowire.

13. The integrated circuit structure of claim 1, wherein the second single crystal semiconductor material has a first lattice parameter and the single crystal gate dielectric material has a second lattice parameter that is within +/−2% of the first lattice parameter.

14. The integrated circuit structure of claim 1, wherein the second single crystal semiconductor material of the semiconductor region has a first lattice parameter and the single crystal dielectric material has a second lattice parameter that is within a tolerance of the first lattice parameter such that there is lattice continuity across the interface between the second single crystal semiconductor material and the single crystal dielectric material.

15. An integrated circuit, comprising:
a substrate comprising a first single crystal semiconductor material;
a semiconductor region directly on the substrate, the semiconductor region including a second single crystal semiconductor material different from the first single crystal semiconductor material;
a gate dielectric layer directly on the semiconductor region and including a single crystal dielectric material that is lattice matched to the second single crystal semiconductor material;
a gate electrode directly on the gate dielectric layer and including a single crystal material that is lattice matched to the second single crystal semiconductor material;
source and drain regions proximate the semiconductor region, such that the semiconductor region is between the source and drain regions; and
source and drain contact structures in contact with the source and drain regions, respectively;
wherein there is lattice continuity across the interface between the second single crystal semiconductor material and the single crystal dielectric material, as well as across the interface between the single crystal dielectric material and the gate electrode single crystal material.

16. The integrated circuit of claim 15, wherein the second single crystal semiconductor material of the semiconductor region includes one or more of silicon, germanium, tin, indium, gallium, arsenic, and aluminum.

17. The integrated circuit of claim 15, wherein the single crystal dielectric material includes one or more of strontium, titanium, lanthanum, aluminum, neodymium, lutetium, and gadolinium.

18. The integrated circuit of claim 15, wherein lattice parameters for each of the second single crystal semiconductor material, the single crystal dielectric material, and the gate electrode single crystal material are within a tolerance of each other, and the tolerance is +/−2%.

19. An integrated circuit, comprising:
a substrate comprising a first semiconductor material;
a semiconductor region on the substrate and comprising a second semiconductor material different from the first semiconductor material;
a gate dielectric directly on the semiconductor region and including a single crystal dielectric material;
a gate electrode directly on the gate dielectric and including a single crystal material that is lattice matched to the single crystal dielectric material;
a source region and a drain region both proximate the semiconductor region, such that the semiconductor region is between the source and drain regions; and
a source contact and a drain contact in contact with the source region and the drain region, respectively.

20. The integrated circuit of claim 19, wherein the semiconductor region includes single crystal semiconductor material, and the single crystal dielectric material is lattice matched to the single crystal semiconductor material.

* * * * *